(12) United States Patent
Pun

(10) Patent No.: US 9,799,804 B2
(45) Date of Patent: Oct. 24, 2017

(54) LIGHT-EMITTING DEVICE WITH NEAR FULL SPECTRUM LIGHT OUTPUT

(71) Applicant: Matrix Lighting Ltd., Shenzhen, Guangdong Province (CN)

(72) Inventor: Cheng Yung Pun, Hong Kong (HK)

(73) Assignee: MATRIX LIGHTING LTD., Tortola (VG)

( * ) Notice: Subject to any disclaimer, the term of this patent is extended or adjusted under 35 U.S.C. 154(b) by 0 days.

(21) Appl. No.: 14/526,095

(22) Filed: Oct. 28, 2014

(65) Prior Publication Data

US 2016/0118550 A1    Apr. 28, 2016

(51) Int. Cl.
| | |
|---|---|
| H01L 33/50 | (2010.01) |
| F21V 9/16 | (2006.01) |
| F21K 9/232 | (2016.01) |
| F21K 9/64 | (2016.01) |
| H01L 25/075 | (2006.01) |
| F21Y 115/10 | (2016.01) |

(52) U.S. Cl.
CPC .......... *H01L 33/504* (2013.01); *F21K 9/232* (2016.08); *F21K 9/64* (2016.08); *F21Y 2115/10* (2016.08); *H01L 25/0753* (2013.01); *H01L 2924/0002* (2013.01)

(58) Field of Classification Search
CPC ....... H01L 33/504; F21V 9/16; F21Y 2101/02
See application file for complete search history.

(56) References Cited

U.S. PATENT DOCUMENTS

| | | |
|---|---|---|
| 4,012,663 A | 3/1977 | Soileau |
| 5,182,490 A | 1/1993 | Holden et al. |
| 5,402,036 A | 3/1995 | Ito |
| 5,608,554 A | 3/1997 | Do et al. |
| 6,234,648 B1 | 5/2001 | Borner et al. |

(Continued)

FOREIGN PATENT DOCUMENTS

| | | |
|---|---|---|
| CN | 2199421 Y | 5/1995 |
| JP | H07176794 A | 7/1995 |

(Continued)

OTHER PUBLICATIONS

Matei, S. (2004). White-Colour with LED's Concepts and Methods for Efficient Solid-State Lighting. Ingineria Iluminatului. Retrieved from: http://journal.florinrpop.ro/13/2004-1/47.pdf.

(Continued)

*Primary Examiner* — Bumsuk Won
*Assistant Examiner* — Jacob R Stern
(74) *Attorney, Agent, or Firm* — Loza & Loza, LLP; George G. C. Tseng; Heidi L. Eisenhut

(57) ABSTRACT

A method for providing light and a light-emitting device configured to providing light in accordance thereto is disclosed herein. The method includes emitting light in a monochromatic manner from a light source, wherein the light provided falls in a first spectrum associated with light of a blue color; covering the light source with a red phosphor composite, wherein the red phosphor composite is configured to cause the first spectrum of the light source to shift to a second, intermediary spectrum associated with light of a violet color; and producing light spanning a fuller visual light spectrum from the light of the violet color received from the red phosphor composite-covered light source.

13 Claims, 9 Drawing Sheets

(56) References Cited

U.S. PATENT DOCUMENTS

| | | |
|---|---|---|
| 6,350,041 B1 | 2/2002 | Tarsa et al. |
| 6,692,136 B2 | 2/2004 | Marshall et al. |
| 6,809,342 B2 | 10/2004 | Harada |
| 6,972,439 B1 | 12/2005 | Kim et al. |
| 7,029,935 B2 | 4/2006 | Negley et al. |
| 7,038,246 B2 | 5/2006 | Uemura |
| 7,083,302 B2 | 8/2006 | Chen et al. |
| 7,091,653 B2 | 8/2006 | Ouderkirk et al. |
| 7,121,691 B2 | 10/2006 | Coushaine et al. |
| 7,125,137 B2 | 10/2006 | Kitajima et al. |
| 7,213,940 B1 | 5/2007 | Van De Ven et al. |
| 7,260,123 B2 | 8/2007 | Sato |
| 7,279,719 B2 | 10/2007 | Suehiro et al. |
| 7,378,686 B2 | 5/2008 | Beeson et al. |
| 7,387,405 B2 | 6/2008 | Ducharme et al. |
| 7,564,180 B2 | 7/2009 | Brandes |
| 7,575,697 B2 | 8/2009 | Li et al. |
| 7,592,192 B2 | 9/2009 | Nabeta et al. |
| 7,614,759 B2 | 11/2009 | Negley |
| 7,703,945 B2 | 4/2010 | Leung et al. |
| 7,737,459 B2 | 6/2010 | Edmond et al. |
| 7,768,192 B2 | 8/2010 | Van De Ven et al. |
| 7,821,194 B2 | 10/2010 | Negley et al. |
| 7,825,574 B2 | 11/2010 | Brunner et al. |
| 8,004,175 B2 | 8/2011 | Toda et al. |
| 8,502,247 B2 | 8/2013 | Baretz et al. |
| 8,513,875 B2 | 8/2013 | Van De Ven et al. |
| 2003/0030063 A1 | 2/2003 | Sosniak et al. |
| 2005/0127833 A1 | 6/2005 | Tieszen |
| 2010/0061078 A1* | 3/2010 | Kim .................................. 362/84 |
| 2010/0308712 A1* | 12/2010 | Liu et al. ........................ 313/503 |
| 2012/0098000 A1* | 4/2012 | Tsang .................... H01L 33/508 257/98 |
| 2013/0093307 A1 | 4/2013 | Cheng |

FOREIGN PATENT DOCUMENTS

| | | |
|---|---|---|
| JP | 2003249693 A | 9/2003 |
| JP | 20040088418 A | 10/2004 |
| JP | 2005317873 A | 11/2005 |
| KR | 20040088446 A | 10/2004 |
| TW | 200536140 | 11/2005 |

OTHER PUBLICATIONS

Niki, I. et al. (Jan. 2004). White LEDs for solid state lighting. Proceedings of SPIE 5187, third international conference on solid state lighting. doi: 10.1117/12.514069.

Ohtaki, T. (Jan. 2005). White-Emitting Phosphor. IBM TDB, 87(1).

Ormond, D. W. (Aug. 1991). Surface Reflectivity System. IBM TDB, 3, 89-90.

Peralta, S. B. et al. (Oct. 1993). Advanced Solid-State Semiconductor Light Sources. Conference Record of IEEE: Industry Applications Society Annual Meeting. Toronto, Ont. 2323-2330. doi: 10.1109/IAS.1993.299201.

Sakuma, K. et al. (Sep. 2004). Warm-white light-emitting diode with yellowish orange SiAlON ceramic phosphor. Optics letters, 29(17), 2001-2003. doi: 10.1364/OL.29.002001.

Werner, K. (Jul. 1994). Higher visibility for LEDs. Spectrum, IEEE, 31(7), 30-34. doi: 10.1109/6.294941.

Wu, H. et al. (May 2005). Three-Band White Light From InGaN-Based Blue LED Chip Precoated With Green/Red Phosphors. IEEE photonics technology letters, 17(6), 1160-1162. Doi: 10.1109/LPT.2005.846504.

\* cited by examiner

LIGHT-EMITTING DEVICE WITH NEAR FULL SPECTRUM LIGHT OUTPUT

BACKGROUND

Field

Aspects of the present disclosure relate generally to solid-states lighting devices, and more particularly, to a light-emitting device with near full spectrum light output.

Background

Light emitting diodes (LEDs) are monochromatic solid-state lighting devices that emit light in one color. Before the advent of blue LEDs, which provided light in a bluish yellow color spectrum through excitation of a phosphor powder in the blue LED semiconductor structure, color output from LEDs were mainly limited to various hues of red, green, and yellow. Using blue LEDs, "light bulbs" may be made by using one LED or by grouping two or more blue LEDs to provide enough light output in an LED bulb. Although light emitted from blue LEDs more closely approaches the appearance of white light, the blue and yellow light produced by these blue LEDs still possesses poor color characteristics, as measured by a quantitative scale defined by the International Commission on Illumination (CIE), based in France, known as color rendering index (CRI). CRI is a quantitative measure of how well a light source is able to illuminate various objects in comparison with an ideal or natural light source to faithfully reproduce the colors of the objects. Thus, light sources with a high CRI are desirable, and their use is a necessity in color-critical applications such as photography and cinematography. In contrast, light sources with low CRI, such as those described above implemented with blue LEDs, are not preferable light sources for everyday use.

It is not uncommon in the lighting industry to find LED bulbs that output a bluish light. As white light is composed of several colors (i.e., white light may only be produced with a mixture of two and more colors), these bulbs will never produce light with desirable characteristics (as measured using CRI) without any source of light in the red spectrum in the light output from these LED bulbs. Because LED bulbs with light output having higher CRIs are more desirable, many LED bulbs also include one or more red LED chips with the one or more blue LEDs in forming the groups of LEDs in each LED bulb. These red LEDs, which emit red light at a wavelength between 600 to 630 nm, introduce a higher value of R9 and hence, a higher CRI can be obtained. The achievement of higher CRI through this approach, however, incurs additional negative effects. For example, color drift of LED chips is related to the temperature of the LED chip, and at high temperatures this drift is quite significant. It should be apparent that a color drift of any of the LEDs in an LED bulb would cause a color drift of the LED bulb. To address this issue, some approaches add a separate electronic driver circuit to the LED bulb to provide some control over the operation of the red LEDs. In addition to increasing complexity of the drive circuit for the LED bulb as a whole, the inclusion of the additional circuitry also increases the cost of each LED bulb and introduces a higher failure rate during production. U.S. Pat. No. 7,213,940 provides that 2 groups of blue and red LEDs with light output in the ranges of 430 nm to 480 nm and 600 nm to 630 nm, respectively, together produces a mixture of light having x, y color coordinates with an area on a 1931 CIE Chromaticity Diagram defined by points having coordinates (0.32, 0.40), (0.36, 0.48), (0.43, 0.45), (0.42, 0.42), (0.36, 0.38). When electric current passes through these LEDs, the LEDs will generate heat and this changes the operating temperature of the blue and red LEDs. Changes in LEDs operating temperature make the color emitted from the LEDs unstable. In addition, because color change of red LEDs due to temperature change occurs at a different rate than blue LEDs, the rate of change in the emitted color from the 2 groups of LEDs itself is unstable. To stabilize the color characteristics in the light that is output, two different electronic LED drive circuits are used to separately control the blue and red LEDs.

On-going demands for improvement to LED technology continue to increase due to the high efficiency possessed by, and varied applications for, these devices. For example, as demand for LED lighting products such as LED bulbs increase, need for more efficient and less-complex solutions to achieve emission of white light with LED bulbs will also increase commensurately.

SUMMARY

The following presents a simplified summary of one or more aspects of the disclosed approach, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, the disclosure provides a light-emitting diode (LED). The LED includes a semiconductor device configured to emit light in a monochromatic manner, wherein the light provided falls in a first spectrum associated with light of a blue color; a red phosphor composite configured to cover the semiconductor device, wherein the red phosphor composite is further configured to cause the light emitted by the semiconductor device to shift to a second, intermediary spectrum associated with light of a violet color; and a luminophoric medium configured to produce light spanning a fuller visual light spectrum from the light of the violet color received from the red phosphor composited covered semiconductor device.

Another aspect of the disclosure provides a light-emitting device that includes a housing including a covering configured to enclose: (1) at least one semiconductor device configured to emit light in a monochromatic manner, wherein the light provided falls in a first spectrum associated with light of a blue color; (2) a red phosphor composite configured to cover the at least one semiconductor device, wherein the red phosphor composite is further configured to cause the light emitted by the at least one semiconductor device to shift to a second, intermediary spectrum associated with light of a violet color; and (3) a luminophoric medium configured to produce light spanning a fuller visual light spectrum from the light of the violet color received from the red phosphor composited covered at least one semiconductor device. The housing further includes a support coupled to the housing upon which the at least one semiconductor device, the red phosphor composite, and the luminophoric medium may be mounted; and an electrical connection configured to couple the at least one semiconductor device to a power source.

Yet another aspect of the disclosed approach provides a method for providing light. The method including emitting light in a monochromatic manner from a light source, wherein the light provided falls in a first spectrum associated with light of a blue color; covering the light source with a red phosphor composite, wherein the red phosphor composite is configured to cause the first spectrum of the light source to shift to a second, intermediary spectrum associated with light of a violet color; and producing light spanning a fuller visual light spectrum from the light of the violet color received from the red phosphor composite-covered light source.

Still yet another aspect of the disclosure provides an apparatus for providing light including means for emitting light in a monochromatic manner from a light source, wherein the light provided falls in a first spectrum associated with light of a blue color; means for covering the light source that includes red phosphor, wherein the red phosphor is configured to cause the first spectrum of the light source to shift to a second, intermediary spectrum associated with light of a violet color; and, means for producing light spanning a fuller visual light spectrum from the light of the violet color received from the red phosphor covered light source.

These and other aspects of the invention will become more fully understood upon a review of the detailed description, which follows.

BRIEF DESCRIPTION OF THE DRAWINGS

These and other sample aspects of the disclosure will be described in the detailed description that follow, and in the accompanying drawings.

Figure 1:
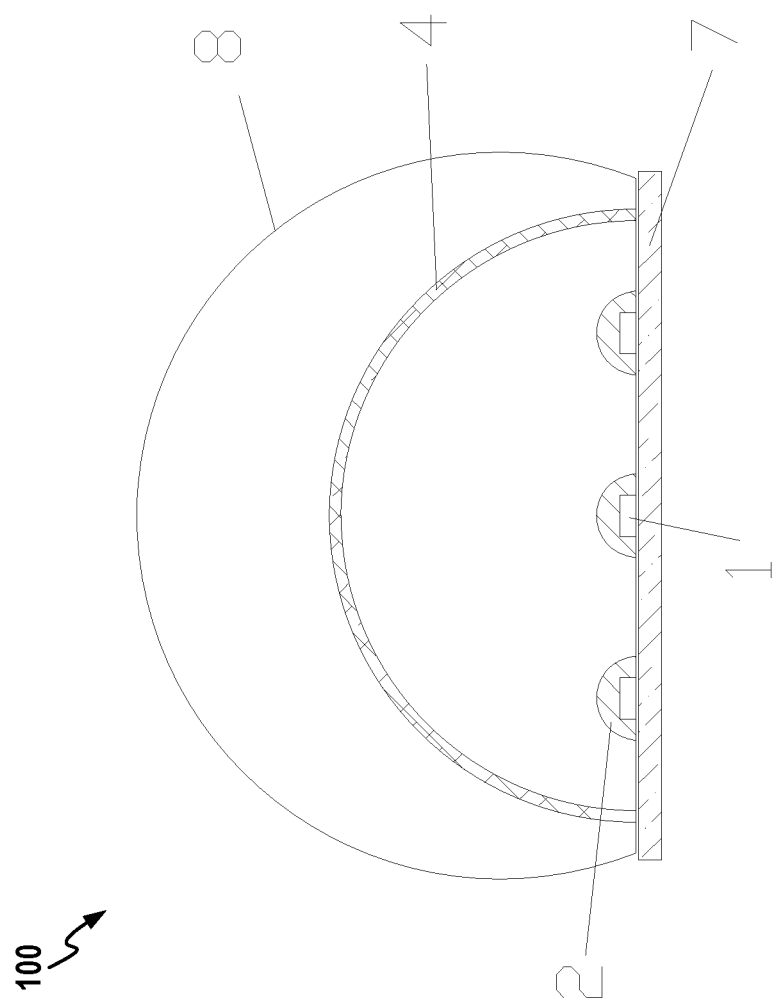
FIG. 1 is a cross-sectional view of a first lighting device configured in accordance with one aspect of a light-emitting device with near full spectrum light output disclosed herein.

In accordance with common practice, some of the drawings may be simplified for clarity. Thus, the drawings may not depict all of the components of a given apparatus (e.g., device) or method. Finally, like reference numerals may be used to denote like features throughout the specification and figures.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Scientists have established that there are fourteen (14) pigment colors that affect color rendition, classified as R1 to R14—with R1-R8 covering pastels, R9-R12 covering saturated solids, and R13-R14 covering earth tones. Color Rendition Index (CRI), which is a baseline measurement used to determine how well colors from a light source compare against those from a "natural" light source such as sunlight, only measures a light source against the first eight (R1-R8) pigment color samples. Since some amount of the color red can be found mixed into the various hues of most processed colors, the ability to accurately reproduce this color is critical for accurately rendering colors of displayed objects. Consequently, even though the CRI measurement does not account for R9, it is an important pigment color because lighting sources with high R9 values produce the most vivid colors. For example, the U.S. Environmental Protection Agency voluntary program of ENERGY STAR, which aims to helps businesses and individuals save money and protect our climate through increasing energy efficiency in electrical and electronic products, defines an acceptable CRI for LED lighting as a value greater than 80 and an R9 value greater than zero. However many LED products fail to meet these standards.

LED lighting devices configured in accordance with various aspects of the light-emitting device with near full spectrum light output disclosed herein are implementable using only one type of blue LED. In one aspect of the disclosed approach, light output of the blue LED is first moved closer to a violet light spectrum using a layer of red phosphor powder, as further described herein. The layer of red phosphor powder may be a mixture of transparent silicon gel with red phosphor powder and attached on top of each individual blue LED. Or, in the alternative, the layer of red phosphor powder may be applied using a mixture of transparent silicon gel and red phosphor powder to form a red phosphor membrane that covers multiple blue LEDs within a short distant, say 2 mm to 5 mm.

In accordance with another aspect of the disclosure, a transmission optical phosphor membrane is then used to filter the light output that has been shifted to the violet spectrum to further change the light output from one associated with violet light to one perceived to closely resemble white light. Using this and other such configurations described herein, use of other types of LEDs such as red LEDs may be eliminated or at least significantly reduced. The various aspects of the light-emitting device with near full spectrum light output disclosed herein provides a more stable color output because only one type of LED is used, which eliminates color drift due to the use of multi-types of LEDs. Another benefit is that the electronic drive circuit is made simpler. Therefore, LED bulbs having good CRI may be obtained without the costs and complexity associated with the use of different types of LEDs.

Experimentation has shown that the efficiency of light energy conversion from the utilization of violet light to exciting phosphor powder is higher than that of infrared light or blue light. Thus, many current approaches utilize violet LED to produce white light. However, because violet LEDs suffer from degradation, the white light that is generated from violet LEDs lacks consistence performance as well as suffer from a short lifetime. See, for example, the Journal of Luminescence, volume 129, issue 12, December 2009, pages 1981-1982, "Different Degradation Bahaviors of InGaN/GaN [Multiple Quantum Wells] MQWs blue and violet LEDs."

"White" LEDs may also be created by covering LEDs with a layer of yellow phosphor powder, such as yttrium aluminum garnet (YAG) powder. However, the light generated by these LEDs has very low or negative value of R9, red color. To compensate for this, red LEDs are included to achieve higher value of R9. In manufacturing LED bulbs, one typical method to obtain higher CRI values is to include one or more red LEDs along with a group of white LEDs. These Red LEDs also provide the LED bulb with a higher value of R9 and hence, a higher CRI may be achieved while addressing the need for better color rendition. However, the color of the red LED drifts according to the working environmental temperature. To counter this, some LED bulb manufacturers include an additional electronic driver circuit to control the red LEDs, but this increases complexity and cost of the electronic circuit in the LED bulb. The present invention uses only one type of blue LED and a layer of red phosphor powder on top of the LED to convert the output of the blue LED to violet spectrum. The violet light then pass through a transmission optical phosphor membranes and change the wavelength of the violet light to white light. By using this configuration, the red LED can be eliminated and therefore, the cost of the LED bulb with good CRI can be obtained.

Hereinafter, various aspects of the disclosure, including preferred aspects, will be described in connection with drawings. Referring to FIG. 1, the figure shows a cross-sectional view of a light-emitting device 100 configured according to one aspect of the disclosure. The light-emitting device 100 shown in FIG. 1 includes one or more semiconductor devices configured to emit light in a monochromatic manner, which are illustrated as blue LEDs 1 arranged on a support 7. In accordance with various aspects of the disclosure, the support 7 may be made of ceramic or aluminum circuit boards for high power LEDs, or specially configured LED lead frames. Preferably, the support 7 may provide good thermal transfer. A layer of red phosphor 2, also as shown in FIG. 1, covers the blue LEDs 1. In one aspect of the disclosed approach, the red phosphor layer 2 may be a composite that includes a phosphor and silicon rubber mixture. The red phosphor layer 2 converts the spectrum of light that is emitted by a blue LED from a color that in the blue light spectrum to a spectrum of light that is the violet color spectrum, the latter spectrum being in a range 380 nm to 420 nm.

As an example, the red phosphor material that may be used as the red phosphor layer 2 includes chemical compounds with the composition of:

(1)

or

(2)

although other similar phosphor materials may be used. These examples of phosphor compositions have been provided herein as pertaining to the shifting of the spectrum of light output by an underlying light source such as blue LEDs. For example, these examples provide for red phosphor with the composition $(SrCA)AlSiN_3Eu^{2+}$, or $(Sr, Ba, Ca)_2Si_5N_8:Eu^{2+}$ to produce the desired output of violet color in the wavelength 380-420 nm from the light output of the blue LEDs 1. It should be understood by those of ordinary skill in the art that it may be desirable to alter the provided exemplary compositions or use other compositions to achieve similar effective results. Thus, it may be preferred to shift light output from the blue LED to other spectrums and a composite may be formulated accordingly. Also, in addition to other composites, the underlying light source may be altered, such as using a different colored LED. Further, other results may be achieved using similar concepts.

Continuing to refer to FIG. 1, the violet light created by the light output of the blue LEDs 1 having been covered by the red phosphor layer 2 will then reach a luminophor 4. The violet light that is transmitted through the luminophor 4 will be converted to white light. In other words, the light output of the luminophor 4 may have characteristics that closely resemble that of white light. In one aspect of the disclosed approach, the luminophor 4 may be created by using yellow or yellow and green phosphor powder. The yellow or yellow and green phosphor powder may be combined with silicone rubber.

Because the efficiency of light energy conversion for utilizing a violet light source to excite phosphor powder is higher than that of an infrared or a blue light, the various aspects of the light-emitting device with near full spectrum light output described herein will produce light output closer to white light in a manner that is more efficient than prior art configurations such as the combination of blue and red LEDs. The white light that is produced will also have higher CRI due to the light combines the color of blue, red, yellow and green. Further, the underlying light source utilizes blue LEDs, which provides longer operational lifetimes.

Figure 2:
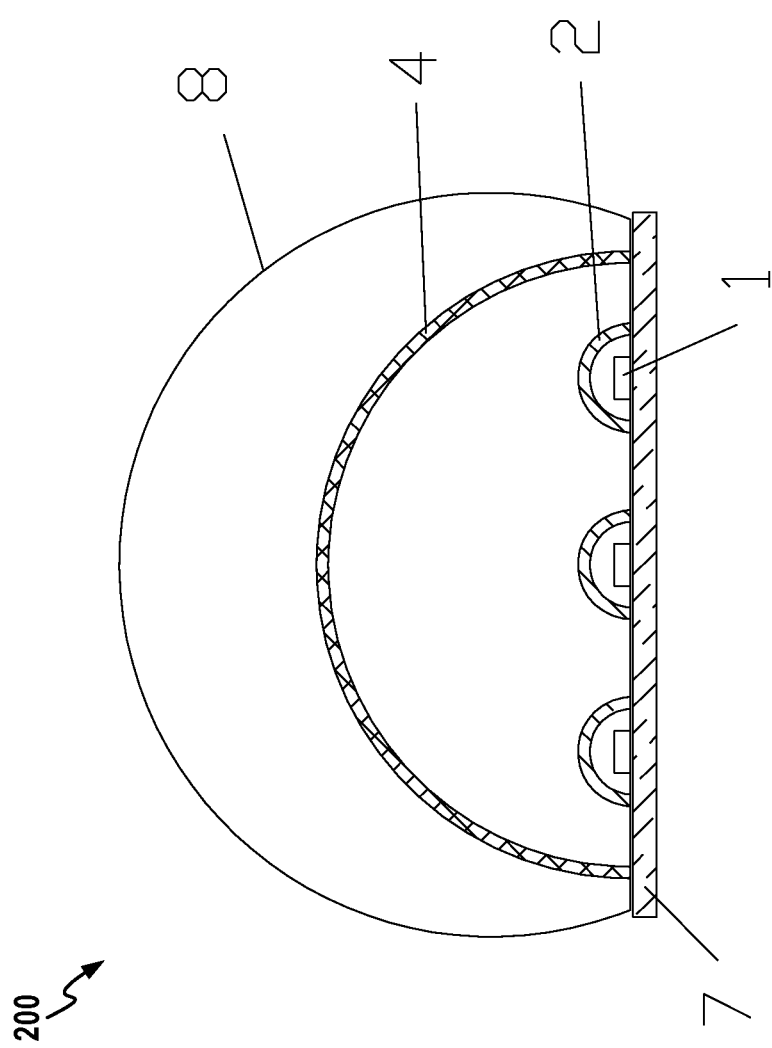
FIG. 2 is a cross-sectional view of a second lighting device configured in accordance with another aspect of the light-emitting device with near full spectrum light output disclosed herein.

Another aspect of the disclosure for the light-emitting device with near full spectrum light output is shown as a light-emitting device 200 in FIG. 2, where a red phosphor mixture may be made into the red phosphor layer 2 configured as a remote phosphor cover with a gap to separate it from the blue LEDs 1 so as to not touch the blue LEDs 1. In one aspect of the disclosed approach, the gap allows the remote phosphor cover to be separated by a minimum distance of 2 mm from the blue LED chips 1 to eliminate conduction of heat that is generate by the blue LEDs to the red phosphor layer 2.

Figure 3:
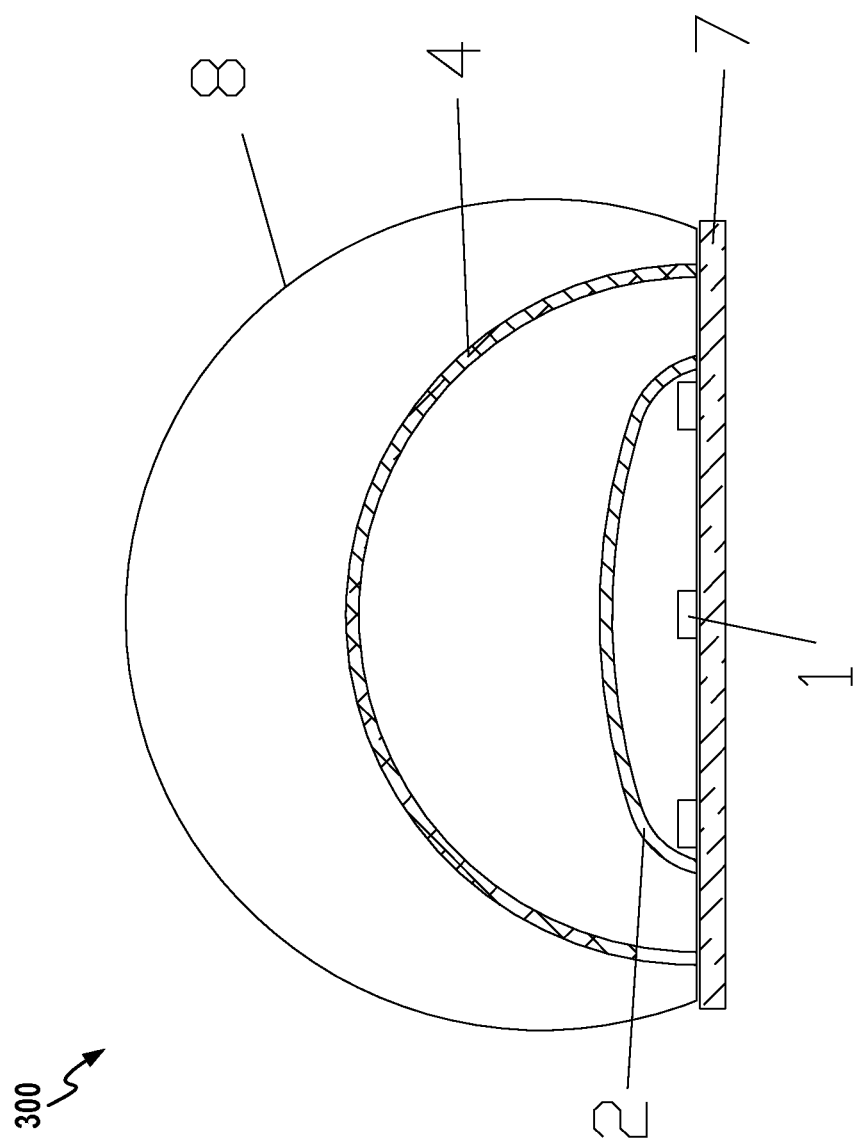
FIG. 3 is a cross-sectional view of a third lighting device configured in accordance with yet another aspect of the light-emitting device with near full spectrum light output disclosed herein.

Yet another aspect of the disclosure for the light-emitting device with near full spectrum light output is shown as a light-emitting device 300 in FIG. 3. For the light-emitting device 300, instead of covering each blue LED 1 such as the approach illustrated in FIG. 1 where the red phosphor layer 2 covers each blue LED, or covering each blue LED 1 such as the approach illustrated in FIG. 2 where the red phosphor layer 2 is configured as a remote phosphor cover for each blue LED, one or more blue LEDs may be covered by a shared red phosphor layer. In one aspect of this disclosed approach, as illustrated in FIG. 3, the red phosphor layer 2 is configured as a remote cover to cover all of the blue LEDs 1.

Figure 4:
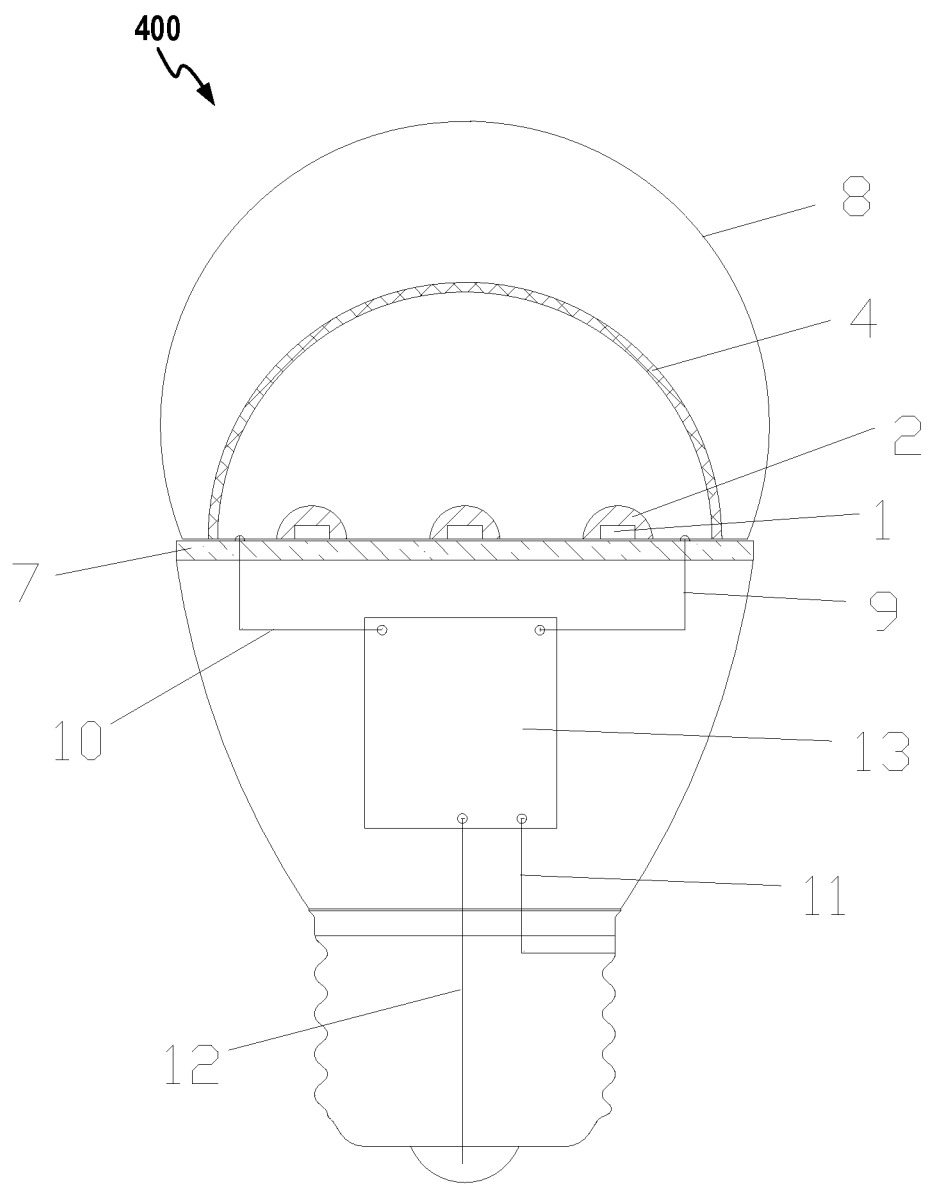
FIG. 4 is a cross-sectional view of a first LED bulb configured in accordance with one aspect of the light-emitting device with near full spectrum light output disclosed herein that may use the first lighting device of FIG. 1.
Figure 5:
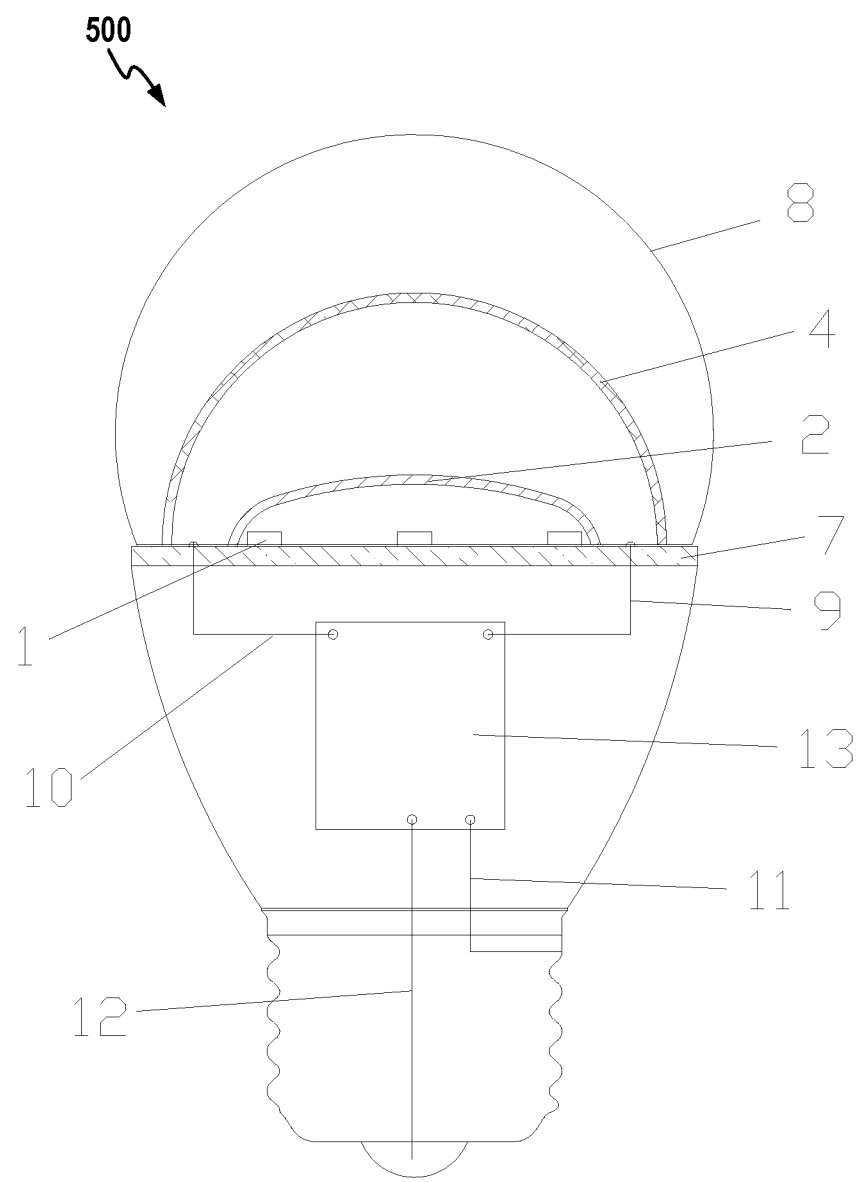
FIG. 5 is a cross-sectional view of a second LED bulb configured in accordance with one aspect of the light-emitting device with near full spectrum light output disclosed herein that may use the third lighting device of FIG. 3.

FIGS. 4 and 5 illustrate cross sectional views of LED lamps 400 and 500, respectively, that may be created using the light-emitting devices configured in accordance with the various aspects of the disclosure provided in FIGS. 1-3. An electronic LED driver board 13 may be installed inside the lamp and a positive voltage wire 10 and a negative voltage wire 9 are connected to the support 7 to provide electricity to the blue LEDs 1. Electrical wires 11 and 12 may then be used as neutral and live wires, respectively, to connect the lamp to a main electrical supply (not shown).

The various aspects of the light-emitting device with near full spectrum light output described herein provides a cost effective approach for manufacturing a white light source with high CRI and good R9 values. The various aspects of the disclosure relates to a method of creating a "white" light source by using only blue LEDs, where violet light with wavelengths of approximately 380 nm to 420 nm may be generated by using blue LEDs. Due to the high number of blue LEDs that is currently produced and the costs of the blue LEDs being much lower than violet LEDs, white light sources created using a light-emitting device with near full spectrum light output configured in accordance with the various aspects disclosed herein will generally be more cost-effective as compared to white light sources created using other approaches.

As described, the blue LEDs excite the red phosphor powder to emit violet light (i.e., light in the spectrum of violet light). The emitted violet light is then further provided through a luminophor, or luminophoric material, for down conversion by the luminophor of the radiation from the spectrum of violet light, to yield a light output with characteristics close to that of a desired white light source. The light generated by this desired white light source may have a high CRI with wavelengths from 500 nm to 650 nm.

Figure 6:
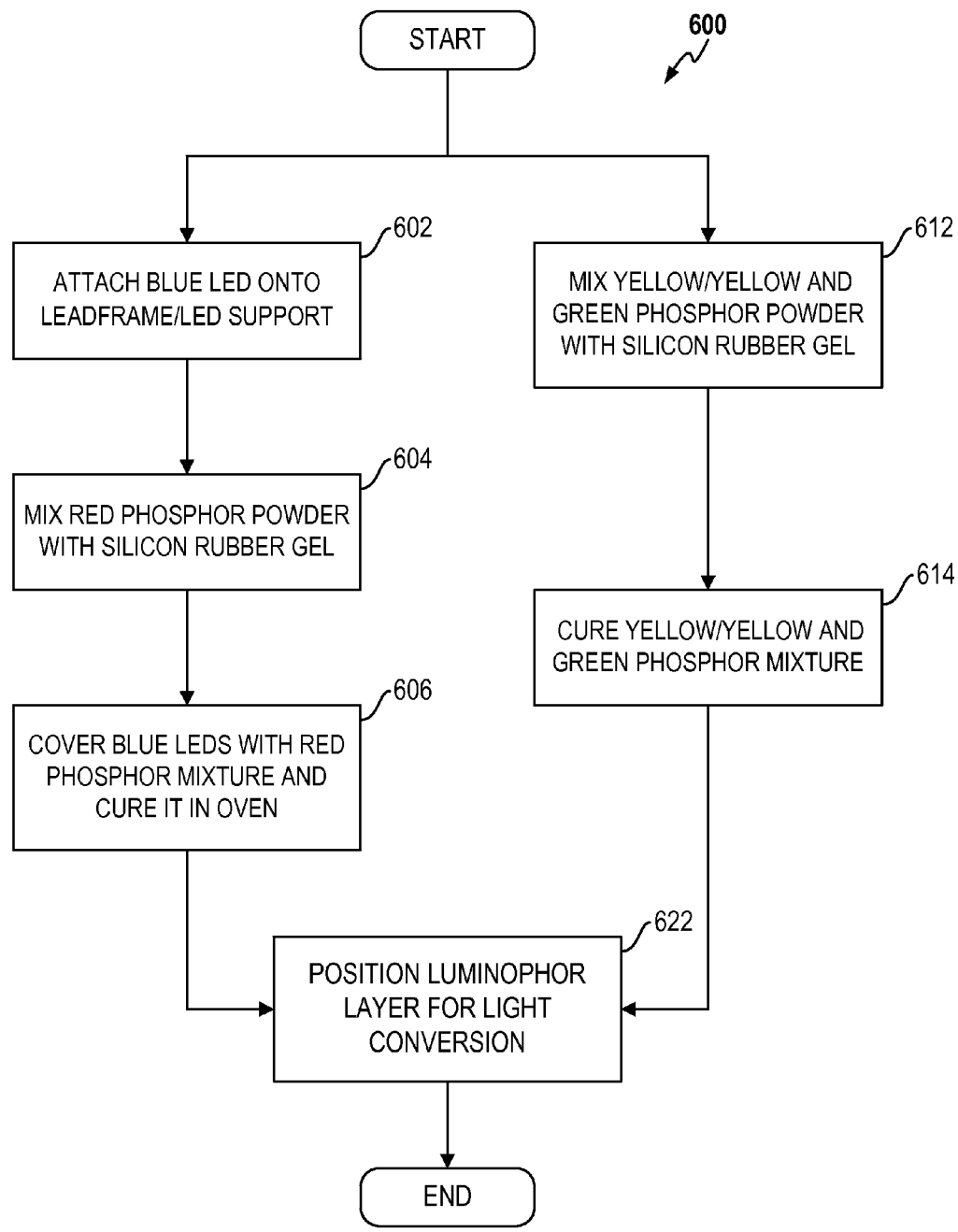
FIG. 6 is a flow diagram illustrating a process for producing a lighting device configured in accordance with various aspects of the light-emitting device with near full spectrum light output disclosed herein.

FIG. 6 illustrates various aspects of a process 600 for creating a light-emitting device with near full spectrum light output configured in accordance with aspects of the various examples disclosed herein. In the description of FIG. 6, reference may be made to FIGS. 7a-7e, which illustrates a light-emitting assembly 700 that may be used to better understand the disclosure related to FIG. 6.

At 602, a plurality of blue LEDs 1 may be attached onto an LED support, or lead frame, 7. In another aspect of the disclosed approach, a single blue LED may be used if the desired light output may be met. In general, any number of blue LEDs may be used.

At 604, a red phosphor composite may be created using a mixture of red phosphor powder and another material. In accordance with various aspects of the disclosed approach, for example, the red phosphor composite may include red phosphor powder combined with transparent silicon gel. Examples of specific formulations have been given, as described above. Other suitable formulations may be used.

Figure 7A:
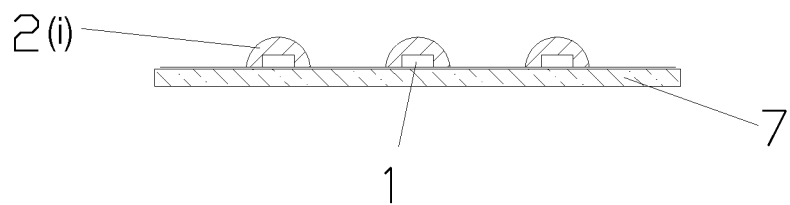
FIGS. 7a-7e are cross-sectional views illustrating various light-emitting assemblies that may be used to better understand the process for producing the lighting device described in FIG. 6.
Figure 7B:
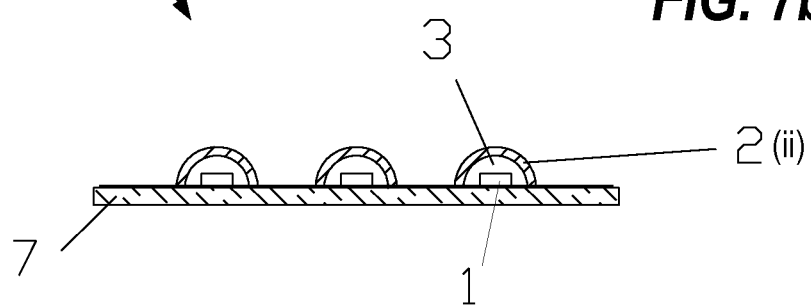
Figure 7C:
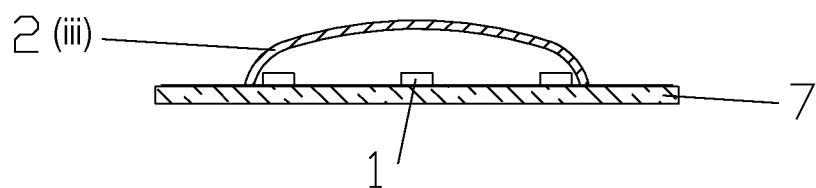
Figure 7D:
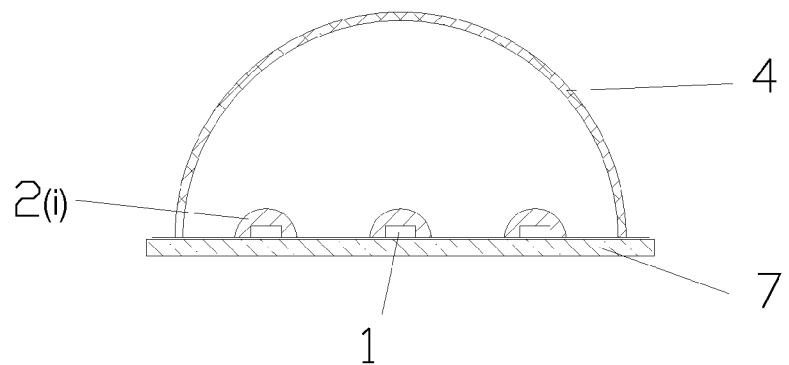
Figure 7E:
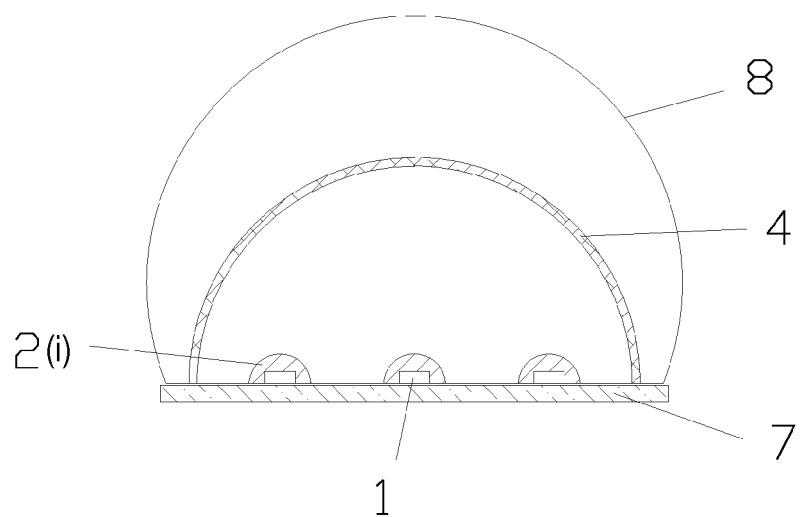

At 606, the layer of red phosphor composite 2 may be used to cover at least one blue LED 1 that may be mounted on the LED support 7, such as that shown by a light-emitting assembly 700a(i) in FIG. 7a. The layer of red phosphor composite 2 as mounted on the light-emitting assembly 700a(i) may then be cured in an oven. In another aspect of the disclosed approach, the blue LEDs 1 may be covered by the layer of red phosphor composite 2 before being attached to the LED support 7 and electrically connected to the electronic LED driver board 13 for power. In the latter approach, the blue LEDs may need to be supported while the layer of red phosphor composite 2 is applied. This may add one or more steps from the standpoint of the assembly process. Thus, although it may be more difficult to modify the blue LEDs in accordance with various aspects of the descriptions disclosed herein to create LEDs that emit violet light before attaching them to the LED support 7, the specific order of operation to achieve the desired configuration should be understood to be non-limiting.

In one aspect of the disclosed approach, as illustrated by the light-emitting assembly 700a(i) in FIG. 7a, the layer of red phosphor composite 2 is provided directly on top of each of the blue LEDs 1 to cover them. In another aspect of the disclosed approach, as illustrated by a light-emitting assembly 700a(ii) in FIG. 7b, a layer of red phosphor composite 2(ii) is set apart from each of the blue LEDs 1 by a separation 3 between the layer of red phosphor composite 2(iii) and the lead frame 7. In yet another aspect of the disclosed approach, as illustrated by a light-emitting assembly 700a(iii) in FIG. 7c, the layer of red phosphor composite 2(iii) may be configured such that it will cover a plurality of the blue LEDs 1. For example, the layer of red phosphor composite 2(iii) may be configured to cover all of the blue LEDs 1.

In accordance with various aspects of the disclosed approach, the layer of red phosphor composite 2 should completely cover the blue LEDs 1. In accordance with various other aspects of the disclosed approach, light output from the blue LEDs 1 should only reach, and thus only be converted by, the layer of red phosphor composite 2. In accordance with still other various aspects of the disclosed approach, substantially all light output from the blue LEDs 1 should reach and be filtered by the layer of red phosphor composite 2.

Referring still to FIG. 6, either during or contemporaneously with any part of the process 600 described at 602-606, at 612, a yellow, or yellow and green, phosphor composite may be created using a mixture of yellow, or yellow and green, respectively, phosphor powder and another material. In accordance with various aspects of the disclosed approach, for example, the yellow phosphor composite may include yellow phosphor powder combined with transparent silicon gel. The yellow, or yellow and green, phosphor composite may perform as a fluorescent and/or phosphorescent solid material. Other suitable formulations may be used.

At 614, the layer of yellow, or yellow and green, phosphor composite 4 may be cured in an oven before being used to cover the blue LEDs 1 that are covered by the layer of red phosphor composite 2. In accordance with aspects of the disclosed approach where one or more blue LEDs have an associated layer of red phosphor composite 2, one or more layers of yellow, or yellow and green, phosphor composites may be used to cover one or more of these associated layers of red phosphor composite 2. In another aspect of the disclosed approach, the blue LEDs 1 may be covered by the layer of red phosphor composite 2 and the layer of yellow, or yellow and green, phosphor composite 4 before being attached to the LED support 7 and electrically connected to the electronic LED driver board 13 for power. In the latter approach, the blue LEDs may need to be supported while the layer of red phosphor composite 2 as well as the layer of yellow, or yellow and green, phosphor composite 4 is applied. (See FIG. 7d) This may add one or more steps from the standpoint of the assembly process. Thus, although it may be more difficult to modify the blue LEDs in accordance with various aspects of the descriptions disclosed herein to create LEDs that emit white light before attaching them to the LED support 7, the specific order of operation to achieve the desired configuration should be understood to be non-limiting.

At 622, the luminophor layer 4 is positioned to receive the light output from the blue LEDs 1 as altered by the layer of red phosphor composite 2. In accordance with various aspects of the light-emitting device with near full spectrum light output, the luminophor layer 4 may be configured to convert the light output from the layer of red phosphor composite 2 from the violet light spectrum to an output that emulates white light. In accordance with various aspects of the disclosed approach, the luminophor layer 4 should completely cover the blue LEDs 1 that are covered by the layer of red phosphor composite 2. In accordance with various other aspects of the disclosed approach, light output from the blue LEDs 1 that are covered by the layer of red phosphor composite 2 should only reach, and thus only be converted by, the luminophor layer 4. In accordance with still other various aspects of the disclosed approach, substantially all light output from the blue LEDs 1 that are covered by the layer of red phosphor composite 2 should reach and be filtered by the luminophor layer 4.

A cover 8 (See FIG. 7e) and other parts, such as support circuitry to drive the blue LEDs, may be used to produce an LED bulb such as those shown in FIGS. 4 and 5. For example, in one aspect of the disclosed approach, the cover 8 may be placed above the luminophor layer 4 and attached to the support 7 before the assembly is coupled to the electronic LED driver board 13. It should be noted that other configurations may be achieved by using a suitable form factor for the cover 8 and any underlying structure used to house and allow electrical connection to the electronic LED driver board 13.

Figure 8:
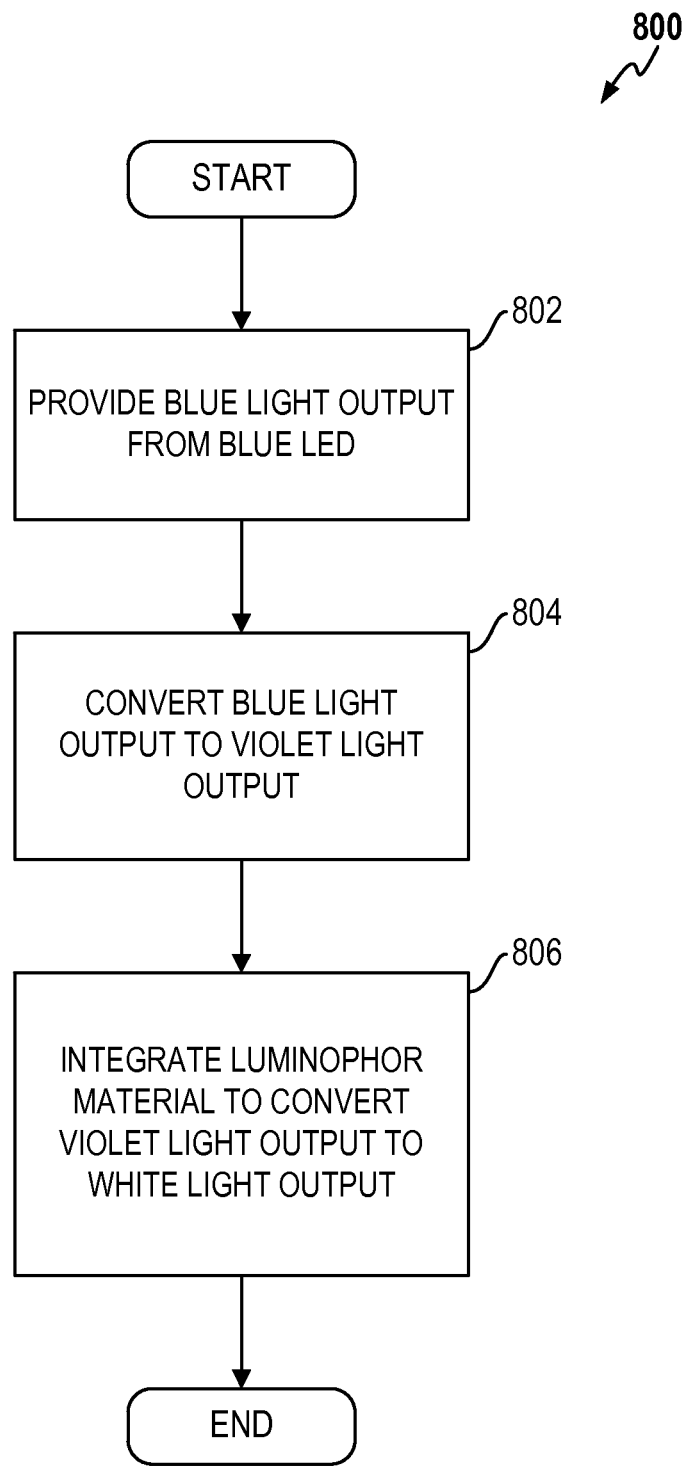
FIG. 8 is a flow diagram illustrating a process for achieving operation of a lighting device configured in accordance with various aspects of the light-emitting device with near full spectrum light output disclosed herein.

FIG. 8 illustrates a process 800 for using blue LEDs to provide light output that emulates white light in accordance with various aspects of the disclosed approach of creating and utilizing the light-emitting device with near full spectrum light output.

At 802, one or more blue LEDs may be used to provide blue light output. Thus, the blue LEDs may output light in the spectrum of blue light. In one aspect of the disclosed approach, the blue LEDs may output light in a range of wavelength values from approximately 450 nm to approximately 465 nm.

At 804, a layer of red phosphor composite may be used to cover the blue LEDs in accordance with various aspects of the disclosure described above. The light emitted by the red phosphor composite-covered blue LEDs may be shifted to be violet light.

At 806, a layer of luminophor material may be used to receive the light emitted from the red phosphor composite-covered blue LEDs. The luminophor material may be a fluorescent and/or phosphorescent solid material as configured in accordance with the examples disclosed above, and this luminophor material may be used to convert the violet light into light output having characteristics resembling that of white light.

Various aspects of the description includes an apparatus for providing light including means for emitting light in a monochromatic manner from a light source, wherein the light provided falls in a first spectrum associated with light of a blue color. Although various approaches may be used, an example provided herein may be blue LEDs described above with reference to the figures, such as the blue LEDs 1. The apparatus may also include means for covering the light source that includes red phosphor, wherein the red phosphor is configured to cause the first spectrum of the light source to shift to a second, intermediary spectrum associated with light of a violet color. An example provided herein for the means for covering the light source may include a layer of red composite such as the layer of red phosphor composite 2 described above with reference to the various figures. The apparatus may also include means for producing light spanning a fuller visual light spectrum from the light of the violet color received from the red phosphor covered light source. As an example, this may include a luminophor layer such as the luminophor layer 4 described above with reference to the various figures. As discussed above, the luminophor layer 4 may include one or more layers of yellow, or yellow and green, phosphor composites.

Although the terms "bulb" and "light bulb" have been used herein to refer to products in which the light-emitting device with near full spectrum light output may be used to implement lighting devices, these terms are chosen for convenience of reference and their association with existing lighting devices. Thus, those of ordinary skill in the art can focus on the various inventive aspects of the light-emitting diodes described herein without introducing additional complexities in the description. Accordingly, it should be understood that the light-emitting device with near full spectrum light output described herein may be utilized in a variety of applications, and no limitations should be assumed or placed thereon from the use of these terms. For example, a lighting device may have a cylindrical shape, such as those possessed by florescent light tubes. In applying the light-emitting device with near full spectrum light output to this type of lighting device, a circuit board configured as a strip may be used to mount a plurality of the light-emitting diodes described herein in a length-wise fashion.

Although the various aspects of the light-emitting device with near full spectrum light output disclosed herein has been described in detail in connection with the various examples shown in the figures, it is to be understood by those skilled in the art that other embodiments may provide the same results. Variations and modifications to the provided examples should be discernable to those skilled in the art and should be considered to fall within the scope of any claims recited herein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A light-emitting diode (LED), comprising:
    a semiconductor device configured to emit light in a monochromatic manner, wherein the light provided falls in a first spectrum associated with light of a blue color having a wavelength from 430 nm to 480 nm;
    a red phosphor composite configured to fully cover the semiconductor device, wherein the red phosphor composite is further configured to cause the light emitted by the semiconductor device to shift to a second, intermediary spectrum associated with light of a violet color having a wavelength from 380 nm to 420 nm; and an overlay having a near semi-spherical shape, the overlay comprising a luminophoric medium configured to completely cover the red phosphor composite such that the light of the violet color received from the red phosphor composite passes through the luminophoric medium, the luminophoric medium being further configured to be excited by the violet light received from the red phosphor composite covered semiconductor device to emit white light, wherein the emitted white light is converted from the violet light received from the red phosphor composite covered semiconductor device.

2. The LED of claim 1, wherein the red phosphor composite comprises a red phosphor and silicon rubber mixture.

3. The LED of claim 1, wherein the semiconductor device comprises an emitting portion configured to emit light, and the LED further comprises a gap between the red phosphor composite to prevent the red phosphor composite from contacting the emitting portion.

4. The LED of claim 1, wherein the semiconductor device comprises an emitting portion configured to emit light, and wherein the red phosphor composite is configured to be in contact with the emitting portion.

5. The LED of claim 1, wherein the emitting portion of the semiconductor device comprises an edge, and the red phosphor composite is configured to be in contact with the edge of the emitting portion.

6. The LED of claim 1, further comprising:
a second semiconductor device configured to emit light in the monochromatic manner;
a substrate configured to support the first semiconductor device and the second semiconductor device; and
a housing configured to enclose the substrate with the first semiconductor device and the second semiconductor device.

7. The LED of claim 1, wherein the luminophoric medium comprising a mixture of fluorescent powder and silicon rubber configured to produce down-converted light from the light emitted by the semiconductor device.

8. The LED of claim 1, further comprising a housing member enclosing the semiconductor device, and wherein the housing member comprises the overlay comprising the luminophoric medium.

9. The LED of claim 1, wherein the luminophoric medium is dispersed in one of a light transmission polymer or glass.

10. The LED of claim 1, wherein the luminophoric medium is dispersed as an exterior film on a light transmission polymer or glass.

11. The LED of claim 1, wherein the luminophoric medium comprises a mixture comprising one of yellow, or yellow and green phosphor powders.

12. A light-emitting device, comprising:
a housing comprising a covering configured to enclose:
(1) at least one semiconductor device configured to emit light in a monochromatic manner, wherein the light provided falls in a first spectrum associated with light of a blue color having a wavelength from 430 nm to 480 nm;
(2) a red phosphor composite configured to fully cover the at least one semiconductor device, wherein the red phosphor composite is further configured to cause the light emitted by the at least one semiconductor device to shift to a second, intermediary spectrum associated with light of a violet color having a wavelength from 380 nm to 420 nm; and
(3) an overlay having a near semi-spherical shape, the overlay comprising a luminophoric medium configured to completely cover the red phosphor composite such that the light of the violet color received from the red phosphor composite passes through the luminophoric medium, the luminophoric medium being further configured to be excited by the violet light received from the red phosphor composite covered semiconductor device to emit white light, wherein the emitted white light is converted from the violet light received from the red phosphor composite covered semiconductor device;
a support coupled to the housing upon which the at least one semiconductor device, the red phosphor composite, and the overlay may be mounted; and
an electrical connection configured to couple the at least one semiconductor device to a power source.

13. A method for providing light comprising:
emitting light in a monochromatic manner from a light source, wherein the light provided falls in a first spectrum associated with light of a blue color having a wavelength from 430 nm to 480 nm;
fully covering the light source with a red phosphor composite, wherein the red phosphor composite is configured to cause the first spectrum of the light source to shift to a second, intermediary spectrum associated with light of a violet color having a wavelength from 380 nm to 420 nm; and
completely covering the red phosphor composite with an overlay having a near semi-spherical shape, the overlay comprising a luminophoric medium such that the light of the violet color received from the red phosphor composite passes through the luminophoric medium, the luminophoric medium configured to be excited by the violet light received from the red phosphor composite covered semiconductor device to emit white light, wherein the emitted white light is converted from the violet light received from the red phosphor composite covered semiconductor device.

* * * * *